United States Patent
Cho et al.

(10) Patent No.: US 9,099,243 B2
(45) Date of Patent: Aug. 4, 2015

(54) MULTILAYER CERAMIC ELECTRONIC COMPONENT AND METHOD OF MANUFACTURING THE SAME

(71) Applicant: SAMSUNG ELECTRO-MECHANICS CO., LTD., Suwon, Gyunggi-do (KR)

(72) Inventors: Su Hwan Cho, Gyunggi-do (KR); Jong Han Kim, Gyunggi-Do (KR); Seung Ho Lee, Gyunggi-do (KR); Jae Yeol Choi, Gyunggi-Do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 113 days.

(21) Appl. No.: 14/061,744

(22) Filed: Oct. 23, 2013

(65) Prior Publication Data

US 2015/0022941 A1    Jan. 22, 2015

(30) Foreign Application Priority Data

Jul. 22, 2013  (KR) .................. 10-2013-0086318

(51) Int. Cl.
  *H01G 4/005* (2006.01)
  *H01G 4/30* (2006.01)
  *H01G 4/06* (2006.01)
  *H05K 1/18* (2006.01)

(52) U.S. Cl.
  CPC .............. *H01G 4/005* (2013.01); *H01G 4/30* (2013.01); *H01G 4/06* (2013.01); *H05K 1/181* (2013.01)

(58) Field of Classification Search
  CPC ......... H05K 1/181; H01G 4/005; H01G 4/06; H01G 4/30
  See application file for complete search history.

(56) References Cited

U.S. PATENT DOCUMENTS

| | | | |
|---|---|---|---|
| 7,466,538 B2* | 12/2008 | Sakamoto et al. | 361/321.1 |
| 8,233,264 B2* | 7/2012 | Cho et al. | 361/303 |
| 8,456,799 B2* | 6/2013 | Chang et al. | 361/321.2 |
| 8,570,710 B2* | 10/2013 | Kim et al. | 361/321.2 |
| 2011/0141652 A1* | 6/2011 | Chang et al. | 361/272 |
| 2011/0157766 A1 | 6/2011 | Cho et al. | |
| 2012/0099241 A1* | 4/2012 | Chang et al. | 361/301.4 |
| 2014/0036408 A1* | 2/2014 | Kim et al. | 361/301.4 |
| 2014/0240898 A1* | 8/2014 | Kim et al. | 361/303 |
| 2014/0311782 A1* | 10/2014 | Lee et al. | 174/260 |
| 2014/0326493 A1* | 11/2014 | Lee et al. | 174/260 |
| 2015/0022944 A1* | 1/2015 | Lee et al. | 361/301.4 |

FOREIGN PATENT DOCUMENTS

| | | |
|---|---|---|
| JP | 2002-164248 A | 6/2002 |
| KR | 10-2011-0073989 A | 6/2011 |

* cited by examiner

*Primary Examiner* — Jeremy C Norris
*Assistant Examiner* — Nathan Milakovich
(74) *Attorney, Agent, or Firm* — McDermott Will & Emery LLP

(57) ABSTRACT

There is provided a multilayer ceramic electronic component includes a ceramic body including a dielectric layer; and an internal electrode formed in the ceramic body, wherein on a cross-section of the ceramic body in a width-thickness direction, a thickness Te of the internal electrode satisfies $0.1\ \mu m \leq Te \leq 1.0\ \mu m$, and when the internal electrode is divided into three regions including a central region and both edge regions in a width direction of the ceramic body and a ratio of an actual total length of the internal electrode corresponding to the sum of lengths of electrode portions to an ideal total length of the internal electrode is defined as connectivity S of the internal electrode, connectivity of the internal electrode in the edge regions satisfies $75\% \leq S \leq 98\%$, and a ratio of connectivity of the internal electrode in the edge regions to connectivity of the internal electrode in the central region is 0.9 to 0.98.

10 Claims, 2 Drawing Sheets

MULTILAYER CERAMIC ELECTRONIC COMPONENT AND METHOD OF MANUFACTURING THE SAME

CROSS-REFERENCE TO RELATED APPLICATION

This application claims the benefit of Korean Patent Application No. 10-2013-0086318 filed on Jul. 22, 2013, with the Korean Intellectual Property Office, the disclosure of which is incorporated herein by reference.

BACKGROUND OF THE INVENTION

1. Field of the Invention

The present invention relates to a multilayer ceramic electronic component and a method of manufacturing the same, and more particularly, to a high capacitance multilayer ceramic electronic component, and a method of manufacturing the same.

2. Description of the Related Art

In general, electronic components using a ceramic material, such as a capacitor, an inductor, a piezoelectric element, a varistor, a thermistor, or the like, include a ceramic body formed of a ceramic material, internal electrodes formed in the ceramic body, and external electrodes mounted on surfaces of the ceramic body so as to be connected to the internal electrodes.

Among ceramic electronic components, a multilayer ceramic capacitor includes a plurality of dielectric layers, internal electrodes disposed to face each other, having the dielectric layer interposed therebetween, and external electrodes electrically connected to the internal electrodes.

The multilayer ceramic capacitor has been widely used as a component for a mobile communication device such as a computer, a personal data assistant (PDA), a mobile phone, or the like, due to advantages such as a small size, high capacitance, ease of mounting, or the like.

Recently, in accordance with the trend toward high performance, slimness and lightness in products produced by the electrical appliances and electronic device industries, relatively small, high performance, and inexpensive electronic components have been required. Particularly, as speeds of central processing units (CPU) have increased and devices have been miniaturized, lightened, digitalized, and have had high degrees of functionality implemented therein, research into technology allowing for miniaturization, thinness, high capacitance, low impedance in a high frequency area, or the like, to be implemented in multilayer ceramic capacitors, has been actively conducted.

Particularly, as thicknesses of the internal electrodes are reduced, a problem in terms of connectivity of the internal electrodes may occur, resulting in a deterioration in reliability of the multilayer ceramic electronic component.

In addition, as thicknesses of the internal electrodes are reduced, a problem in terms of connectivity of the internal electrodes may occur, resulting in a problem in implementing high capacitance in the multilayer ceramic electronic component.

RELATED ART DOCUMENT (Patent Document 1) Japanese Patent Laid-open Publication No. 2002-164248

SUMMARY OF THE INVENTION

An aspect of the present invention provides a multilayer ceramic electronic component and a method of manufacturing the same, and more particularly, a high capacitance multilayer ceramic electronic component, and a method of manufacturing the same.

According to an aspect of the present invention, there is provided a multilayer ceramic electronic component including: a ceramic body including a dielectric layer; and an internal electrode formed in the ceramic body, wherein on a cross section of the ceramic body in a width-thickness direction, a thickness Te of the internal electrode is within a range of 0.1 µm to 1.0 µm (0.1 µm≤Te≤1.0 µm), and when the internal electrode is divided into three regions including a central region and both edge regions in a width direction of the ceramic body and a ratio of an actual total length of the internal electrode corresponding to the sum of lengths of electrode portions to an ideal total length of the internal electrode is defined as connectivity S of the internal electrode, connectivity S of the internal electrode in the edge regions thereof is within a range of 75% to 98% (75%≤S≤98%), and a ratio of the connectivity of the internal electrode in the edge regions thereof to connectivity of the internal electrode in the central region thereof is within a range of 0.9 to 0.98.

The edge regions may be regions occupying 20% or less of the internal electrode, based on a total width of the internal electrode, from respective edges of the internal electrode.

The dielectric layer may have a thickness Td of 2.0 µm or less (Td≤2.0 µm).

The internal electrode may be formed of a conductive paste containing a conductive metal powder and a ceramic powder.

When an average particle size of the conductive metal powder is defined as Dn and an average particle size of the ceramic powder is defined as Ds, 1/80≤Ds/Dn≤1/2 may be satisfied.

A content ratio of the ceramic powder to the conductive metal powder may be within a range of 1.0 to 25%.

According to an aspect of the present invention, there is provided a method of manufacturing a multilayer ceramic electronic component, the method including: preparing a conductive paste containing a conductive metal powder and a ceramic powder, when an average particle size of the conductive metal powder is defined as Dn and an average particle size of the ceramic powder is defined as Ds, the conductive paste satisfying 1/80≤Ds/Dn≤1/2; forming internal electrode layers on individual ceramic green sheets using the conductive paste; stacking the ceramic green sheets on which the internal electrode layers are formed; and sintering a multilayer body formed by stacking the ceramic green sheets to form a ceramic body including a dielectric layer and an internal electrode, wherein when the internal electrode is divided into three regions including a central region and both edge regions in a width direction of the ceramic body and a ratio of an actual total length of the internal electrode corresponding to the sum of lengths of electrode portions to an ideal total length of the internal electrode is defined as connectivity S of the internal electrode, connectivity S of the internal electrode in the edge regions thereof is within a range of 75% to 98% (75%≤S≤98%), and a ratio of the connectivity of the internal electrode in the edge regions thereof to connectivity of the internal electrode in the central region thereof is within a range of 0.9 to 0.98.

A content ratio of the ceramic powder to the conductive metal powder may be within a range of 1.0% to 25%.

The edge regions may be regions occupying 20% or less of the internal electrode, based on a total width of the internal electrode, from respective edges of the internal electrode.

The dielectric layer may have a thickness Td of 2.0 µm or less (Td≤2.0 µm).

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
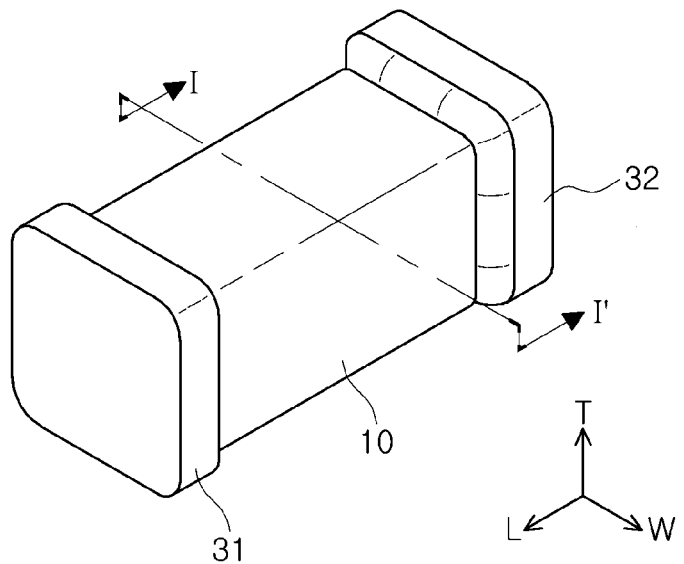
FIG. 1 is a perspective view of a multilayer ceramic electronic component according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

FIG. 1 is a perspective view of a multilayer ceramic electronic component according to an embodiment of the present invention.

Figure 2:
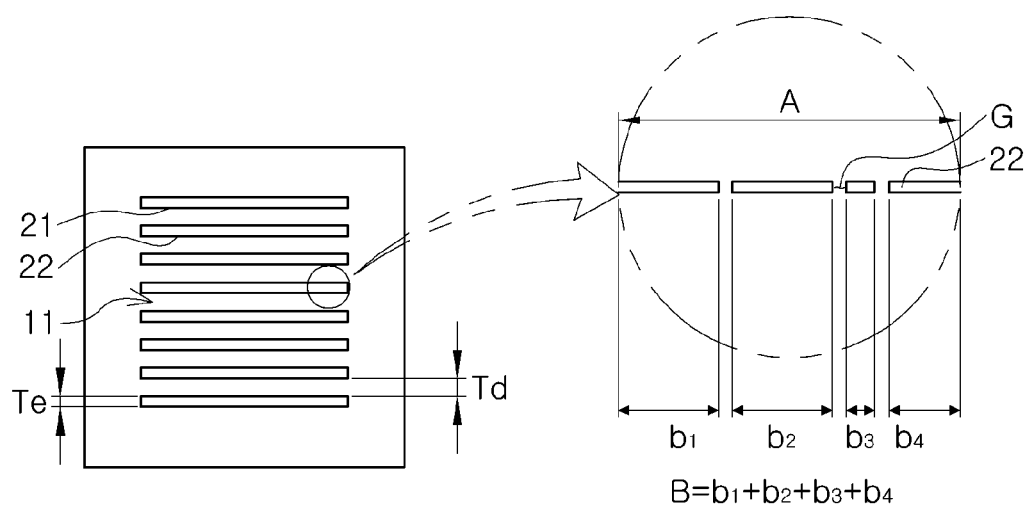
FIG. 2 is a cross-sectional view taken along line I-I' of FIG. 1 for illustrating electrode connectivity.

FIG. 2 is a cross-sectional view taken along line I-I' of FIG. 1 for illustrating electrode connectivity.

Figure 3:
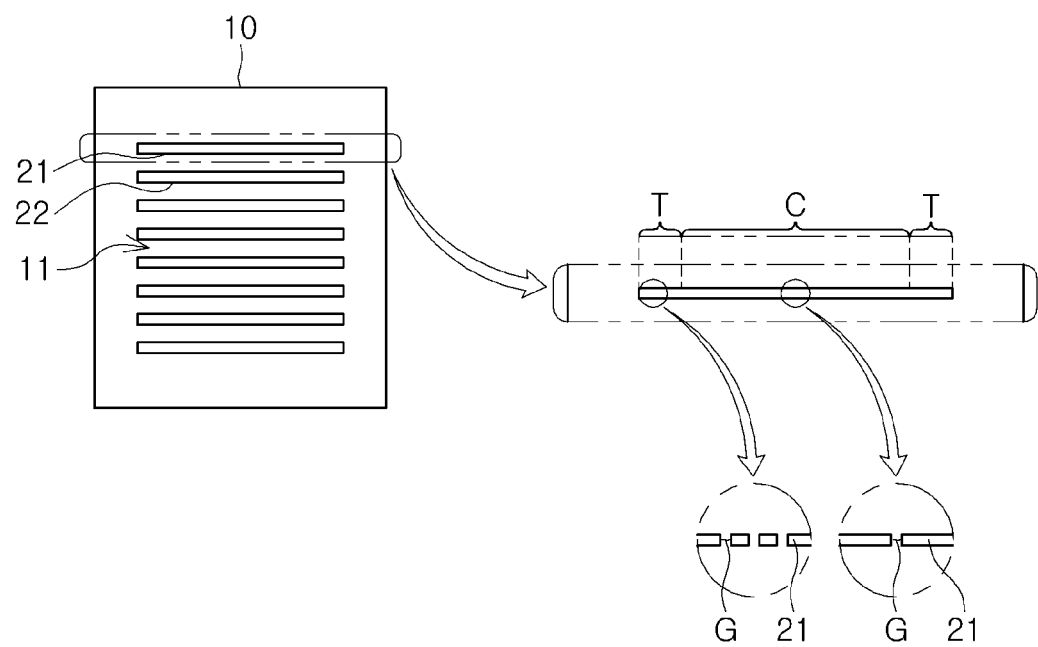
FIG. 3 is a cross-sectional view taken along line I-I' of FIG. 1 for illustrating electrode connectivity in each region of an internal electrode.

FIG. 3 is a cross-sectional view taken along line I-I' of FIG. 1 for illustrating electrode connectivity in each region of an internal electrode.

Referring to FIGS. 1 through 3, a multilayer ceramic electronic component according to an embodiment of the invention may include a ceramic body 10, internal electrodes 21 and 22 formed in the ceramic body, and external electrodes 31 and 32 formed outwardly of the ceramic body 10.

With regard to directions of the multilayer ceramic capacitor according to the embodiment of the invention, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' is the same as a direction in which dielectric layers are laminated, that is, the 'lamination direction'.

In the embodiment of the invention, a shape of the ceramic body 10 is not particularly limited, but may be hexahedral as shown in FIG. 1.

In the embodiment of the invention, the ceramic body 10 may have first and second main surfaces facing each other, first and second side surfaces facing each other, and first and second end surfaces facing each other. The first and second main surfaces may refer to upper and lower surfaces of the ceramic body 10, respectively.

The ceramic body 10 may include dielectric layers 11, and the dielectric layers 11 may contain a dielectric material having high permittivity.

Since the dielectric material contains an electric dipole, a large amount of charge accumulation may be induced.

According to the embodiment of the invention, a raw material forming the dielectric layers 11 is not particularly limited as long as sufficient capacitance may be obtained, but may be, for example, barium titanate ($BaTiO_3$) powder.

As a material forming the dielectric layers 11, various ceramic additives, organic solvents, plasticizers, binders, dispersing agents, and the like, may be added to a powder such as a barium titanate ($BaTiO_3$) powder, or the like.

An average particle size of the ceramic powder used to form the dielectric layers 11 is not particularly limited, and may be controlled in order to achieve high capacitance. For example, the average particle size of the ceramic powder may be controlled to be 400 nm or less.

The internal electrodes 21 and 22, a pair of electrodes having opposite polarities, may be formed by printing a conductive paste including a conductive metal on the dielectric layers 11 at a predetermined thickness.

In addition, the internal electrodes 21 and 22 may be formed to be alternately exposed to both end surfaces of the ceramic body 10 and may be electrically insulated from each other by the dielectric layer 11 disposed therebetween.

That is, the internal electrodes 21 and 22 may have the first and second internal electrodes 21 and 22 and be electrically connected to the external electrodes 31 and 32 through portions thereof alternately exposed to the end surfaces of the ceramic body 10, respectively.

Therefore, when voltage is applied to the external electrodes 31 and 32, electric charges may be accumulated between the first and second internal electrodes 21 and 22 facing each other. In this case, capacitance of the multilayer ceramic capacitor may be in proportion to an area of an overlap region between the first and second internal electrodes 21 and 22.

Further, the conductive metal contained in the conductive paste forming the internal electrodes 21 and 22 may be nickel (Ni), copper (Cu), palladium (Pd), or an alloy thereof, but the invention is not limited thereto.

In addition, as a printing method of the conductive paste, a screen printing method, a gravure printing method, or the like, may be used, but the invention is not limited thereto.

According to the embodiment of the invention, when a thickness of the internal electrode 21 or 22 is defined as Te, Te may be within a range of 0.1 µm to 1.0 µm (0.1 µm≤Te≤1.0 µm).

The thickness Te of the internal electrode 21 or 22 may be an average value. An average value of the thickness Te of the internal electrode 21 or 22 may be calculated by measuring thicknesses of the internal electrode 21 or 22 at ten equidistant points thereof on an image obtained by scanning a cross-section (W-T cross-section) of the ceramic body 110 in the width-thickness direction using a scanning electron microscope (SEM).

The thickness of the internal electrode 21 or 22 may be calculated as a ratio (an area of the internal electrode/an actual length of the internal electrode) of the area of the internal electrode 21 or 22 to the actual length of the internal electrode 21 or 22.

Referring to FIG. 2, the area of the internal electrode 21 or 22 may refer to an area of a region including electrode portions, and the actual length of the internal electrode 21 or 22 may refer to a total length of electrode portions thereof except for gaps G formed within the internal electrode.

The area of the internal electrode 21 or 22 and the actual length of the internal electrode 21 or 22 may be measured with respect to a single internal electrode, and be then multiplied by the number of stacked internal electrodes to thereby be generalized with respect to the entire multilayer ceramic capacitor.

According to the embodiment of the invention, the thickness Te of the internal electrode 21 or 22 is controlled to be within a range of 0.1 µm to 1.0 µm (0.1 µm≤Te≤1.0 µm), such that even in the case that the thickness of the internal electrode is reduced, a high capacitance multilayer ceramic electronic component having excellent reliability may be realized.

In the case in which the thickness Te of the internal electrode 21 or 22 is less than 0.1 µm, it may be difficult to implement high capacitance in a multilayer ceramic capacitor, and in the case in which the thickness Te of the internal electrode 21 or 22 is greater than 1.0 µm, it may be difficult to implement reductions in thicknesses of internal electrodes in a multilayer ceramic capacitor.

A specific method of manufacturing the high capacitance multilayer ceramic electronic component having excellent reliability while allowing the thickness Te of the internal electrode 21 or 22 to be within a range of 0.1 µm to 1.0 µm (0.1 µm≤Te≤1.0 µm) will be described below.

According to the embodiment of the invention, the external electrodes 31 and 32 may be formed on both ends of the ceramic body 10.

The external electrodes 31 and 32 may be formed on the end surfaces of the ceramic body 10 in the length direction ("L direction") thereof.

The external electrodes 31 and 32 may be partially extended to the upper and lower surfaces and the side surfaces of the ceramic body 10.

The external electrodes 31 and 32 may include the first and second external electrodes 31 and 32, and the first and second external electrodes 31 and 32 may receive electricity having opposite polarities applied thereto.

The external electrodes 31 and 32 may contain a conductive metal and glass. The conductive metal may include at least one selected from a group consisting of gold, silver, palladium, copper, nickel, and alloys thereof.

According to the embodiment of the invention, in the case in which the internal electrode 21 or 22 is divided into three regions, that is, a central region C and both edge regions T, in the width direction of the ceramic body 10, when a ratio of an actual total length of electrode portions to an ideal total length of the internal electrode is defined as connectivity S of the internal electrode, the connectivity S of the internal electrode in both edge regions T may be within a range of 75% to 98% (75%≤S≤98%).

Referring to FIG. 2, the connectivity of the internal electrode 21 or 22 will be defined as follows.

Generally, the internal electrodes 21 and 22 formed in the multilayer ceramic capacitor may not be continuously connected without a disconnected region.

Since a process of forming the internal electrodes 21 and 22 is performed by printing a conductive paste formed of a conductive metal powder containing nickel (Ni), or the like, on one surfaces of ceramic green sheets, an empty space may remain in the internal electrodes.

Therefore, when viewed in a cross-section of the multilayer ceramic capacitor cut in a certain direction, the internal electrodes 21 and 22 are not continuously connected but have gaps G between portions thereof.

Referring to FIG. 2, when a length of the internal electrode 21 or 22 including the gaps G is defined as A, and the sum of lengths of electrode portions of the internal electrode excluding the gaps G is defined as B, the connectivity S of the internal electrode may be defined as B/A.

The ideal total length of the internal electrode 21 or 22 and the actual total length of the internal electrode 21 or 22 corresponding to the sum of the lengths of the electrode portions of the internal electrode excluding the gaps G may be measured using an optical image obtained by scanning the cross-section of the multilayer ceramic capacitor.

More specifically, the ratio of the actual total length of the electrode portions to the ideal total length of the internal electrode may be measured from the image obtained by scanning the cross-section of the ceramic body in the width direction, after being cut in a central portion of the ceramic body in the length direction thereof.

As shown in FIG. 2, the ideal total length of the internal electrode 21 or 22 and the actual total length of the internal electrode 21 or 22 may be measured by selecting part of the optical image.

More specifically, when a length of the internal electrode 21 or 22 including the gaps G in a specific region of the internal electrode 21 or 22 is defined as A and lengths of electrode portions of the internal electrode 21 or 22 excluding the gaps G are defined as b1, b2, b3, and b4, the connectivity of the internal electrode 21 or 22 may be (b1+b2+b3+b4)/A. Here, the electrode portions are represented as b1, b2, b3, and b4 in FIG. 2, but the number of electrode portions is not particularly limited.

The actual length of the internal electrode 21 or 22 may be measured by subtracting lengths of the gaps G from the ideal total length A of the internal electrode 21 or 22.

Hereinafter, a change in capacitance according to the connectivity of the internal electrode and a possibility of cracking due to thermal shock will be described.

In the case in which the connectivity of the internal electrode is high, since the internal electrode is formed to have less disconnected portions, higher capacitance may be secured as compared to the case in which the connectivity of the internal electrode is low.

However, in the case in which thermal shock due to a step caused by a difference in thermal expansion coefficients between a material (for example, a metal such as nickel (Ni), or the like) forming the internal electrode and a ceramic is applied to the internal electrode, cracking or a dielectric breakdown phenomenon may be easily generated.

On the other hand, in the case in which the connectivity of the internal electrode is low, it may be difficult to secure desired capacitance; however, the step generated due to the difference in thermal expansion coefficients between the material forming the internal electrode and the ceramic may be alleviated, whereby the cracking and the dielectric breakdown phenomenon due to the thermal shock may be prevented.

Therefore, in view of stably securing capacitance and preventing the cracking and the dielectric breakdown phenomenon due to the thermal shock, the connectivity of the internal electrode needs to be suitably adjusted.

In addition, the ceramic powder contained in the internal electrode, together with the conductive metal, may serve to delay shrinkage of the internal electrode during sintering, which has a significant influence on the connectivity of the internal electrode, such that the ceramic powder is associated with the capacitance of the multilayer ceramic capacitor.

Particularly, electrode connectivity in both ends of internal electrodes may be significantly deteriorated due to the method of printing the internal electrodes, resulting in a reduction in capacitance. Therefore, electrode connectivity in both ends of the internal electrodes needs to be adjusted.

A method of adjusting the connectivity of the internal electrode as described above is not particularly limited. For example, a method of adjusting a particle size of the ceramic powder contained in the conductive paste, a method of adjusting a sintering temperature, or the like, may be used, and a detailed description thereof will be provided below.

Referring to FIG. 3, in the case in which the internal electrode 21 or 22 is divided into three regions in the width direction of the ceramic body 10, that is, the central region C, and the edge regions T, the connectivity S of the internal electrode in the edge regions T may be within a range of 75% to 98% (75%≤S≤98%).

The connectivity S of the internal electrode in the edge regions T may be adjusted within a range of 75% to 98% ((75%≤S≤98%) to improve capacitance, whereby a high capacitance multilayer ceramic capacitor may be realized.

In the case in which the connectivity S of the internal electrode in the edge regions T is less than 75%, it may be difficult to implement target capacitance.

In the case in which the connectivity of the internal electrode is high, the internal electrode is formed with a relatively narrow empty space therein, so that high capacitance may be secured.

On the other hand, in the case in which the connectivity of the internal electrode is low, an effective surface forming capacitance may be decreased, which may be disadvantageous in the forming of capacitance.

In the case in which the connectivity S of the internal electrode in the edge regions T is greater than 98%, an effect of reducing stress may be insignificant, so that cracks may be generated.

The internal electrode may be shrunk in the thickness direction during a sintering process, and as a result, disconnected portions may be formed in the thickness direction.

The disconnected portions formed in the internal electrode may serve to relax stress in the ceramic body.

In the case in which the connectivity of the internal electrode is excessively high, since there is less stress relaxation effect resulting from the disconnected portions, cracks may be generated.

In addition, since a path to remove remaining coal that should be removed during the sintering process is blocked, stress may be concentrated, such that cracks may be generated.

The edge regions T may be regions occupying 20% or less of the internal electrode, based on a total width thereof, from respective edges of the internal electrode 21 or 22 on the W-T cross-section of the ceramic body 10, but is not particularly limited thereto.

The high capacitance multilayer ceramic capacitor may be obtained by adjusting the connectivity of the internal electrode in the edge regions T, corresponding to the regions occupying 20% or less of the internal electrode, based on the total width thereof, from the edges of the internal electrode 21 or 22.

According to the embodiment of the invention, a ratio of connectivity of the internal electrode in the edge regions T to connectivity of the internal electrode in the central region c may be 0.90 to 0.98.

The high capacitance multilayer ceramic capacitor having excellent reliability may be obtained by adjusting the ratio of the connectivity of the internal electrode in the edge regions T to the connectivity of the internal electrode in the central region c to satisfy 0.90 to 0.98.

In the case in which the ratio of the connectivity of the internal electrode in the edge regions T to the connectivity of the internal electrode in the central region c is less than 0.90, the capacitance of the multilayer ceramic capacitor may be decreased, such that it may be difficult to implement target capacitance.

In the case in which the ratio of the connectivity of the internal electrode in the edge regions T to the connectivity of the internal electrode in the central region c is more than 0.98, the connectivity of the internal electrode in the central region c and the edge regions T is excessively high, cracking may occur.

In the embodiment of the invention, when a thickness of the dielectric layer 11 is defined as Td, Td may be 2.0 μm or less (Td≤2.0 μm).

The thickness Td of the dielectric layer 11 may refer to an average thickness of the dielectric layer.

In the embodiment of the invention, the average thickness of the dielectric layer 11 may refer to an average thickness of dielectric layers 11 disposed between the internal electrodes 21 and 22.

The average thickness of the dielectric layer 11 may be measured from an image obtained by scanning a cross-section of the ceramic body 110 in the width direction thereof using a scanning electron microscope (SEM) as shown in FIG. 2.

For example, as shown in FIG. 2, with respect to the dielectric layer 11 randomly selected from the image obtained by scanning the cross-section (W-T cross-section) of the ceramic body 10 in the width-thickness (W-T) directions, after being cut in the central portion of the ceramic body 10 in the length (L) direction, using a scanning electron microscope (SEM), thicknesses of the dielectric layer 11 at thirty equidistant points thereof may be measured and an average value thereof may be calculated.

The thicknesses of the dielectric layer at thirty equidistant points may be measured in a capacitance forming part, a region in which the internal electrodes 21 and 22 are overlapped with each other.

In addition, when an average thickness of at least ten dielectric layers is measured by the above-mentioned method, the average thickness of the dielectric layer may be further generalized.

Hereinafter, a method of adjusting the connectivity of the internal electrode, particularly, a method of adjusting a particle size of the ceramic powder contained in the conductive paste forming the internal electrode will be described in detail, but the invention is not limited thereto.

In the embodiment of the invention, the internal electrodes 21 and 22 may be formed of a conductive paste containing a conductive metal powder and a ceramic powder.

When an average particle size of the conductive metal powder is defined as Dn and an average particle size of the ceramic powder is defined as Ds, Ds/Dn may be within a range of 1/80 to 1/2 (1/80≤Ds/Dn≤1/2).

In the case of dispersing the ceramic powder particles between the metal powder particles while controlling a particle size ratio thereof, the sintering of the metal powder may be suppressed to about 1000° C. or greater.

The sintering of the metal powder may be maximally suppressed to a predetermined temperature, and the sintering of the ceramic powder forming the dielectric layer may be initiated.

As the ceramic powder forming the dielectric layer becomes compact, the compactness of the internal electrode may be initiated, and the sintering process may rapidly progress.

The ceramic powder may delay the initiation of sintering shrinkage of the metal powder and suppress the sintering shrinkage of the metal powder.

The ceramic powder whose particle size ratio is controlled may block contact between the metal powder particles at the time of sintering shrinkage of the metal powder to suppress particle growth of the metal powder and suppress the aggregation of the particles in the internal electrode.

As described above, a ratio of the average particle size Ds of the ceramic powder to the average particle size Dn of the conductive metal powder is adjusted within a range of 1/80 to 1/2 (1/80≤Ds/Dn≤1/2), such that the connectivity S of the internal electrode in the edge regions T may be adjusted within a range of 75% to 98% (75%≤S≤98%).

The connectivity S of the internal electrode in the edge regions T is adjusted within a range of 75% to 98% (75%≤S≤98%) to improve capacitance, whereby a high capacitance multilayer ceramic capacitor may be realized.

In the case in which the ratio of the average particle size Ds of the ceramic powder to the average particle size Dn of the conductive metal powder is less than 1/80, the average particle size of the ceramic powder is excessively small, such that the connectivity of the internal electrode in the edge regions T may not satisfy 75% or greater.

In the case in which the ratio of the average particle size Ds of the ceramic powder to the average particle size Dn of the conductive metal powder is greater than 1/2, it may be difficult to efficiently suppress the shrinkage of the conductive metal powder using the ceramic powder.

Further, in the embodiment of the invention, a content ratio of the ceramic powder to the conductive metal powder may be 1.0% to 25%.

When the content ratio of the ceramic powder to the conductive metal powder is 1.0% to 25%, the connectivity S of the internal electrode in the edge regions T may be within a range of 75% to 98% (75%≤S≤98%).

In the case in which the content ratio of the ceramic powder to the conductive metal powder is less than 1.0%, the connectivity of the internal electrode in the edge regions T may not satisfy 75% or greater.

In the case in which the content ratio of the ceramic powder to the conductive metal powder is more than 25%, the content of the ceramic powder is excessively high, such that a non-electrode region may be increased in the internal electrode, whereby it may be difficult to secure desired capacitance.

According to another embodiment of the invention, there is provided a method of manufacturing a multilayer ceramic electronic component, the method including: preparing a conductive paste containing a conductive metal powder and a ceramic powder, and when an average particle size of the conductive metal powder is defined as Dn and an average particle size of the ceramic powder is defined as Ds, the conductive paste satisfying the following Equation: 1/80≤Ds/Dn≤1/2; forming internal electrode layers on individual ceramic green sheets using the conductive paste; stacking the ceramic green sheets on which the internal electrode layers are formed; and sintering a multilayer body formed by stacking the ceramic green sheets to form a ceramic body including dielectric layers and internal electrodes, wherein in the case in which each of the internal electrodes is divided into three regions (a central region and both edge regions) in a width direction of the ceramic body, when a ratio of an actual total length of the internal electrode corresponding to the sum of lengths of electrode portions to an ideal total length of the internal electrode is defined as connectivity S of the internal electrode, connectivity S of the internal electrode in the edge regions is within a range of 75% to 98% (75%≤S≤98%), and a ratio of the connectivity of the internal electrode in the edge regions to the connectivity of the internal electrode in the central region is 0.9 to 0.98.

First, a paste for external electrodes may be prepared by mixing a conductive metal powder for imparting conductivity to the external electrodes 31 and 32, a glass powder for compactness of the external electrodes 31 and 32, ethanol as an organic solvent, polyvinyl butyral as a binder, and the like, with one another and then ball-milling the mixture A conductive paste composition for the internal electrodes 21 and 22 may further contain a binder, a solvent, other additives, and the like.

As the binder, polyvinyl butyral, a cellulose based resin, or the like may be used, but the binder is not limited thereto. The polyvinyl butyral may improve adhesion strength between the conductive paste and the ceramic green sheet.

The cellulose based resin having a chair type structure may be rapidly recovered due to elasticity in the case in which deformation is generated. As the conductive paste composition contains the cellulose based resin, a flat printing surface may be secured.

The solvent is not particularly limited, but may be, for example, butylcarbitol, kerosene, or a terpineol based solvent. A specific example of the terpineol based solvent may include dihydroterpineol, dihydroterpinyl acetate, and the like, but is not limited thereto.

Next, a conductive paste may be prepared to include a conductive metal powder and a ceramic powder, and when the average particle size of the conductive metal powder is defined as Dn and the average particle size of the ceramic powder is defined as Ds, the conductive paste may satisfy the following Equation: 1/80≤Ds/Dn≤1/2.

Since the particle size of the ceramic powder is smaller than that of the metal powder, the ceramic powder particles may be distributed between the metal powder particles.

Then, the internal electrode layers may be formed on the ceramic green sheets using the conductive paste.

The conductive paste may be printed on the ceramic green sheets by a screen printing method, or the like.

Thereafter, the ceramic green sheet multilayer body may be prepared by stacking the ceramic green sheets on which the internal electrode layers are formed, and a green chip may be manufactured by cutting the multilayer body. The green chip may be sintered, and then the external electrodes 31 and 32 may be formed on external surfaces of the sintering chip, thereby manufacturing a multilayer ceramic electronic component.

In the case of using a base metal as the internal electrodes 21 and 22, when the sintering process is performed under air atmosphere, the internal electrodes 21 and 22 may be oxidized. Thus, the sintering process may be performed under reducing atmosphere.

In addition, the external electrodes 31 and 32 may include a nickel plating layer and a tin plating layer formed thereon so as to facilitate ease of mounting.

In the present embodiment, a ratio of a weight of the ceramic powder to a weight of the conductive metal may be 1.0% to 25%.

The conductive metal may include nickel.

The ceramic powder is not particularly limited, but may include, for example, barium titanate or strontium titanate.

A description of the same features as those of the multilayer ceramic electronic component according to the previous embodiment of the invention will be omitted in order to avoid redundancy.

Hereinafter, multilayer ceramic capacitors according to Inventive Examples and Comparative Examples will be described in detail.

Multilayer ceramic capacitors according to Inventive Examples and Comparative Examples were prepared as follows.

Barium titanate powder, ethanol as an organic solvent, and polybutyral as a binder were mixed and ball-milled to prepare ceramic slurry, and ceramic green sheets were manufactured using the ceramic slurry.

Internal electrodes were formed by printing a conductive paste for internal electrodes containing nickel on the ceramic green sheets, and a green sheet multilayer body formed by stacking the green sheets was isostatically pressed under a pressure of 1,000 kgf/cm² at 85° C.

A green chip was formed by cutting the pressed green sheet multilayer body, and the cut green chip was subjected to a de-binding process in which the green chip was maintained at 230° C. for 60 hours under air atmosphere. Thereafter, the green chip was sintered to thereby manufacture a sintered chip. The sintering process was performed under reducing atmosphere so as to prevent oxidation of the internal electrodes, and in the reducing atmosphere, the pressure was $10^{-11}$ to $10^{-10}$ atm lower than Ni/NiO equilibrium oxygen partial pressure.

External electrodes were formed on external portions of the sintered chip using a paste for external electrodes containing a copper powder and a glass powder. Then, a nickel plating layer and a tin plating layer were formed on the external electrodes by electroplating.

A multilayer ceramic capacitor having a 0603 size was manufactured by the above-mentioned method. The 0603 size may refer to a length of 0.6 μm±0.1 μm and a width of 0.3 μm±0.1 μm. Individual multilayer ceramic capacitors were evaluated as follows.

In the case in which the measured capacitance was higher than 90.2% of a target capacitance value, the capacitance property was evaluated as good (○), and in the case in which the measured capacitance was lower than 90.2% of the target capacitance value, the capacitance property was evaluated as poor (X).

In terms of evaluating the occurrence of cracking, the occurrence of cracking was represented by ○, and no occurrence of cracking was represented by X.

TABLE 1

| SAMPLE No. | Ds/Dn | CERAMIC CONTENT/ NICKEL CONTENT (%) | CONNECTIVITY OF ELECTRODE IN BOTH EDGE REGIONS THEREOF [%] | CAPACITANCE (%) |
|---|---|---|---|---|
| *1 | 2/1 | 12.3 | 60.99 | 75.3 |
| *2 | 1/1 | 3.4 | 59.54 | 73.5 |
| *3 | 2/3 | 15.7 | 61.88 | 76.4 |
| *4 | 3/5 | 16.4 | 57.67 | 71.2 |
| *5 | 1/2 | 0.8 | 63.83 | 78.8 |
| *6 | 1/3 | 25.3 | 63.50 | 78.4 |
| 7 | 1/4 | 12.2 | 77.14 | 95.3 |
| 8 | 1/4 | 7.0 | 75.88 | 91.2 |
| 9 | 1/6 | 5.3 | 75.69 | 90.5 |
| 10 | 1/6 | 18.2 | 76.06 | 90.2 |
| 11 | 1/12 | 12.2 | 78.00 | 96.3 |
| 12 | 1/12 | 24.3 | 76.55 | 94.5 |
| 13 | 1/36 | 1.2 | 75.95 | 91.3 |
| 14 | 1/30 | 12.5 | 75.24 | 95.6 |
| *15 | 1/81 | 1.6 | 64.40 | 79.5 |

*Comparative Example

Referring to Table 1, in samples 1 to 6 and 15 corresponding to Comparative Examples in which a ratio of an average particle size Ds of the ceramic powder to an average particle size Dn of the conductive metal powder and a content ratio of the ceramic powder to the conductive metal powder were outside of the numerical ranges of the inventive concept, the connectivity of the internal electrode in the edge regions thereof was less than 75%, whereby the target capacitance was not implemented.

Meanwhile, it may be appreciated that in samples 7 to 14 corresponding to Inventive Examples in which the ratio of the average particle size Ds of the ceramic powder to the average particle size Dn of the conductive metal powder and the content ratio of the ceramic powder to the conductive metal powder were within the numerical ranges of the inventive concept, the connectivity of the internal electrode in the edge regions thereof was 75% or greater, whereby the target capacitance was implemented.

TABLE 2

| SAMPLE No. | RATIO (%) OF CONNECTIVITY OF ELECTRODE IN BOTH EDGE REGIONS THEREOF TO CONNECTIVITY OF ELECTRODE IN CENTRAL REGION THEREOF | CAPACITANCE (%) | OCCURRENCE OF CRACKING |
|---|---|---|---|
| *1 | 76.24 | 75.3 | X |
| *2 | 74.43 | 73.5 | X |
| *3 | 77.35 | 76.4 | X |
| *4 | 72.09 | 71.2 | X |
| *5 | 86.71 | 85.6 | X |
| *6 | 79.79 | 78.8 | X |
| *7 | 88.56 | 87.5 | X |
| *8 | 84.55 | 83.5 | X |
| *9 | 79.32 | 78.4 | X |
| *10 | 98.72 | 95.3 | ○ |
| 11 | 92.35 | 91.2 | X |
| *12 | 89.61 | 88.5 | X |
| *13 | 86.27 | 85.2 | X |
| 14 | 91.33 | 90.2 | X |
| 15 | 97.50 | 96.3 | X |
| *16 | 98.56 | 97.3 | ○ |
| 17 | 92.44 | 91.3 | X |
| *18 | 84.34 | 83.3 | X |
| *19 | 76.55 | 75.6 | X |
| *20 | 80.50 | 79.5 | X |

*Comparative Example

Referring to Table 2, it may be appreciated that in samples 1 to 10, 12, 13, 16, and 18 to 20 corresponding to Comparative Examples in which a ratio of connectivity of the internal electrode in both edge regions thereof to connectivity of the internal electrode in a central region thereof was outside of the numerical range of the inventive concept, the target capacitance was not implemented, or cracking occurred.

Meanwhile, it may be appreciated that in samples 11, 14, 15, and 17 corresponding to Inventive Examples in which the ratio of the connectivity of the internal electrode in the edge regions thereof to the connectivity of the internal electrode in the central region thereof was within the numerical range of the inventive concept, the target capacitance was implemented, and cracking did not occur.

As set forth above, according to embodiments of the invention, a size ratio between barium titanate power particles and nickel powder particles contained in a paste for internal electrodes, amounts thereof, and a sintering temperature or the like may be adjusted to improve the connectivity of internal electrodes in both edges regions thereof in the width direction, whereby a high capacitance multilayer ceramic electronic component having excellent reliability may be manufactured.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic electronic component comprising:
a ceramic body including a dielectric layer; and
an internal electrode formed in the ceramic body,
wherein, on a cross section of the ceramic body in a width-thickness direction, a thickness Te of the internal electrode is within a range of 0.1 μm to 1.0 μm (0.1 μm≤Te≤1.0 μm), and
when the internal electrode is divided into three regions including a central region and both edge regions in a width direction of the ceramic body and a ratio of an actual total length of the internal electrode corresponding to the sum of lengths of electrode portions to an ideal total length of the internal electrode is defined as connectivity S of the internal electrode, connectivity S of the internal electrode in the edge regions thereof is within a range of 75% to 98% (75%≤S≤98%), and a ratio of the connectivity of the internal electrode in the edge regions thereof to connectivity of the internal electrode in the central region thereof is within a range of 0.9 to 0.98.

2. The multilayer ceramic electronic component of claim 1, wherein the edge regions are regions occupying 20% or less of the internal electrode, based on a total width of the internal electrode, from respective edges of the internal electrode.

3. The multilayer ceramic electronic component of claim 1, wherein the dielectric layer has a thickness Td of 2.0 μm or less (Td≤2.0 μm).

4. The multilayer ceramic electronic component of claim 1, wherein the internal electrode is formed of a conductive paste containing a conductive metal powder and a ceramic powder.

5. The multilayer ceramic electronic component of claim 4, wherein when an average particle size of the conductive metal powder is defined as Dn and an average particle size of the ceramic powder is defined as Ds, 1/80≤Ds/Dn≤1/2 is satisfied.

6. The multilayer ceramic electronic component of claim 4, wherein a content ratio of the ceramic powder to the conductive metal powder is within a range of 1.0% to 25%.

7. A method of manufacturing a multilayer ceramic electronic component, the method comprising:
preparing a conductive paste containing a conductive metal powder and a ceramic powder, when an average particle size of the conductive metal powder is defined as Dn and an average particle size of the ceramic powder is defined as Ds, the conductive paste satisfying 1/80≤Ds/Dn≤1/2;
forming internal electrode layers on individual ceramic green sheets using the conductive paste;
stacking the ceramic green sheets on which the internal electrode layers are formed; and
sintering a multilayer body formed by stacking the ceramic green sheets to form a ceramic body including a dielectric layer and an internal electrode,
wherein when the internal electrode is divided into three regions including a central region and both edge regions in a width direction of the ceramic body and a ratio of an actual total length of the internal electrode corresponding to the sum of lengths of electrode portions to an ideal total length of the internal electrode is defined as connectivity S of the internal electrode, connectivity S of the internal electrode in the edge regions thereof is within a range of 75% to 98% (75%≤S≤98%), and a ratio of the connectivity of the internal electrode in the edge regions thereof to connectivity of the internal electrode in the central region thereof is within a range of 0.9 to 0.98.

8. The method of claim 7, wherein a content ratio of the ceramic powder to the conductive metal powder is within a range of 1.0% to 25%.

9. The method of claim 7, wherein the edge regions are regions occupying 20% or less of the internal electrode, based on a total width of the internal electrode, from respective edges of the internal electrode.

10. The method of claim 7, wherein the dielectric layer has a thickness Td of 2.0 μm or less (Td≤2.0 μm).

* * * * *